(12) United States Patent
Eblen et al.

(10) Patent No.: US 9,331,000 B2
(45) Date of Patent: May 3, 2016

(54) HEAT MANAGEMENT IN ELECTRONICS PACKAGING

(71) Applicant: Kyocera America Inc, San Diego, CA (US)

(72) Inventors: Mark Eblen, Temecula, CA (US); Franklin Kim, San Diego, CA (US); Chong Il-Park, Poway, CA (US); Shinichi Hira, San Diego, CA (US)

(73) Assignee: Kyocera America, Inc., San Diego, CA (US)

( * ) Notice: Subject to any disclaimer, the term of this patent is extended or adjusted under 35 U.S.C. 154(b) by 0 days.

(21) Appl. No.: 14/677,601

(22) Filed: Apr. 2, 2015

(65) Prior Publication Data

US 2015/0287661 A1    Oct. 8, 2015

Related U.S. Application Data

(60) Provisional application No. 61/974,155, filed on Apr. 2, 2014.

(51) Int. Cl.
*H01L 23/10* (2006.01)
*H01L 23/495* (2006.01)
(Continued)

(52) U.S. Cl.
CPC ........ *H01L 23/3675* (2013.01); *H01L 21/4871* (2013.01); *H01L 21/50* (2013.01); *H01L 23/047* (2013.01); *H01L 23/36* (2013.01); *H01L 24/49* (2013.01); *H01L 24/85* (2013.01); *H01L 25/0655* (2013.01); *H01L 25/50* (2013.01); *H01L 23/3736* (2013.01); *H01L 2224/04042* (2013.01); *H01L 2224/05599* (2013.01); *H01L 2224/291* (2013.01); *H01L 2224/2919* (2013.01); *H01L 2224/32245* (2013.01); *H01L 2224/45124* (2013.01); *H01L 2224/48137* (2013.01); *H01L 2224/48153* (2013.01); *H01L 2224/48195* (2013.01); *H01L 2224/48247* (2013.01); *H01L 2224/73265* (2013.01); *H01L 2224/83192* (2013.01); *H01L 2224/85399* (2013.01); *H01L 2224/92247* (2013.01); *H01L 2924/01026* (2013.01); *H01L 2924/01028* (2013.01); *H01L 2924/01029* (2013.01); *H01L 2924/0132* (2013.01); *H01L 2924/01042* (2013.01); *H01L 2924/01074* (2013.01); *H01L 2924/1033* (2013.01); *H01L 2924/10253* (2013.01); *H01L 2924/141* (2013.01); *H01L 2924/1421* (2013.01); *H01L 2924/19041* (2013.01); *H01L 2924/19105* (2013.01); *H01L 2924/206* (2013.01); *H01L 2924/2065* (2013.01); *H01L 2924/30111* (2013.01); *H01L 2924/3511* (2013.01)

(58) Field of Classification Search
CPC . H01L 23/36; H01L 23/367; H01L 23/49568; H01L 23/49586
USPC .......................... 257/707, 676, 713, E23.051
See application file for complete search history.

(56) References Cited

U.S. PATENT DOCUMENTS 5,550,406 A * 8/1996 McCormick ....... G01R 1/07342
                                                            257/666
6,262,513 B1 * 7/2001 Furukawa ............... H01L 21/56
                                                            257/E21.502

(Continued)

*Primary Examiner* — Nitin Parekh

(57) ABSTRACT

An electronics packaging system includes an insulator that electrically insulates a heat sink from electrical leads. An interface between the insulator and the heat sink includes a stress reliever constructed such that a stiffness of the interface is greater than the stiffness of the interface without the stress reliever.

10 Claims, 3 Drawing Sheets

(51) Int. Cl.
*H01L 23/367* (2006.01)
*H01L 21/48* (2006.01)
*H01L 23/00* (2006.01)
*H01L 25/065* (2006.01)
*H01L 25/00* (2006.01)
*H01L 23/047* (2006.01)
*H01L 23/36* (2006.01)
*H01L 21/50* (2006.01)
*H01L 23/373* (2006.01)

(56) References Cited

U.S. PATENT DOCUMENTS

| | | | |
|---|---|---|---|
| 6,307,755 B1 * | 10/2001 | Williams | H01L 23/4334 174/260 |
| 6,387,732 B1 * | 5/2002 | Akram | H01L 23/3114 257/E23.039 |
| 6,891,265 B2 * | 5/2005 | Mamitsu | H01L 23/051 257/713 |
| 6,936,855 B1 * | 8/2005 | Harrah | F21K 9/00 257/59 |
| 8,067,834 B2 * | 11/2011 | Moline | H01L 21/568 257/712 |
| 2003/0224554 A1 | 12/2003 | Ludtke et al. | |
| 2004/0232529 A1 | 11/2004 | Lobsinger et al. | |
| 2005/0029535 A1 | 2/2005 | Mazzochette et al. | |
| 2007/0152322 A1 | 7/2007 | Inomata et al. | |
| 2008/0093718 A1 * | 4/2008 | Pavio | H01L 23/047 257/675 |
| 2012/0018873 A1 | 1/2012 | Iruvanti et al. | |

* cited by examiner

HEAT MANAGEMENT IN ELECTRONICS PACKAGING

RELATED APPLICATIONS

This application claims the benefit of U.S. Provisional Patent Application Ser. No. 61/974,155, filed on Apr. 2, 2014, and incorporated herein in its entirety.

FIELD

This invention generally relates to electronics packaging and more particularly to management of thermal energy in electronics packaging.

BACKGROUND

A variety of different electronic devices generate large amounts of heat that can affect their packaging. For example, amplifiers used to drive the antenna of a cellular communications tower or base station generate large levels of heat. As a result, the packaging for these amplifiers typically includes a heat sink for dissipating the heat from the amplifier. The packaging also includes an insulator that is attached to the heat sink so as to provide electrical insulation between the leads for the packaging and the electronic devices within the packaging. There is generally a large differential between the Coefficient of Thermal Expansion (CTE) between the heat sink and the insulator. As a result, the interface between the heat sink and insulator can warp and/or camber in response to change in temperature. This warping can disrupt the thermal pathways within the system and can even lead to breaking and/or cracking of the packaging.

A variety of efforts have been made to address the problems that result from the CTE differential; however, these efforts have either made the system undesirably expensive, sacrificed thermal conduction, and/or reduced reliability. For instance, CPC (copper-copper/moly-copper) laminate heat sinks have been used in an effort make the CTE of the heat sink closer to the CTE of the insulator. However, these heat sinks have proven to be undesirably expensive. As a result, there is a need for an improved packaging system.

SUMMARY

An electronics packaging system includes an insulator that electrically insulates a heat sink from electrical leads. An interface between the insulator and the heat sink includes a stress reliever constructed such that a stiffness of the interface is greater than the stiffness of the interface without the stress reliever. One or more electronic devices can be positioned on the heat sink and in an opening through the insulator. The one or more electronic devices can be electronically connected to the leads.

A method of generating an electronics packaging system includes concurrently bonding together multiple components. The components include leads, an insulator, a heat sink and one or more electronic devices. The components are bonded together such that the insulator electrically isolates the leads from the heat sink and the one or more electronic devices are positioned on the heat sink. The method also includes making electrical connections between the one or more electronic devices and the leads after bonding together the components.

Another method of generating an electronics packaging system includes bonding together multiple components. The components including leads, an insulator, and a heat sink. The components are bonded together such that the insulator electrically isolates the leads from the heat sink. The method also includes bonding one or more electronic devices to the heat sink after bonding together the components. The method also includes making electrical connections between the one or more electronic devices and the leads after bonding together the components.

DETAILED DESCRIPTION

An electronics packaging system includes one or more electronic devices positioned on a heat sink. An insulator is also positioned on the heat sink. An opening through the insulator can define a cavity 24 in which the devices are positioned. The insulator is generally configured to electrically insulate the heat sink from leads that are used to connect the system to an external circuit.

An interface between the insulator and the heat sink includes a stress reliever that was not present in prior devices. The stress reliever has a stiffness that increases the resistance of the interface to warping and/or camber. The increased resistance to warping and/or camber allows the difference between the Coefficient of Thermal Expansion (CTE) for the insulator and the heat sink to be increased above the level that could be achieved in prior devices. As a result, materials that were not previously not used for the heat sink become surprisingly practical. For instance, the heat sink can include or consist of Oxygen Free Copper (OFC). Materials such as OFC are much cheaper than the currently used heat sinks and have a high level of thermal conductivity. Accordingly, the presence of the stress reliever in the interface can provide reduced packaging costs in combination with high performance levels.

Figure 1A:
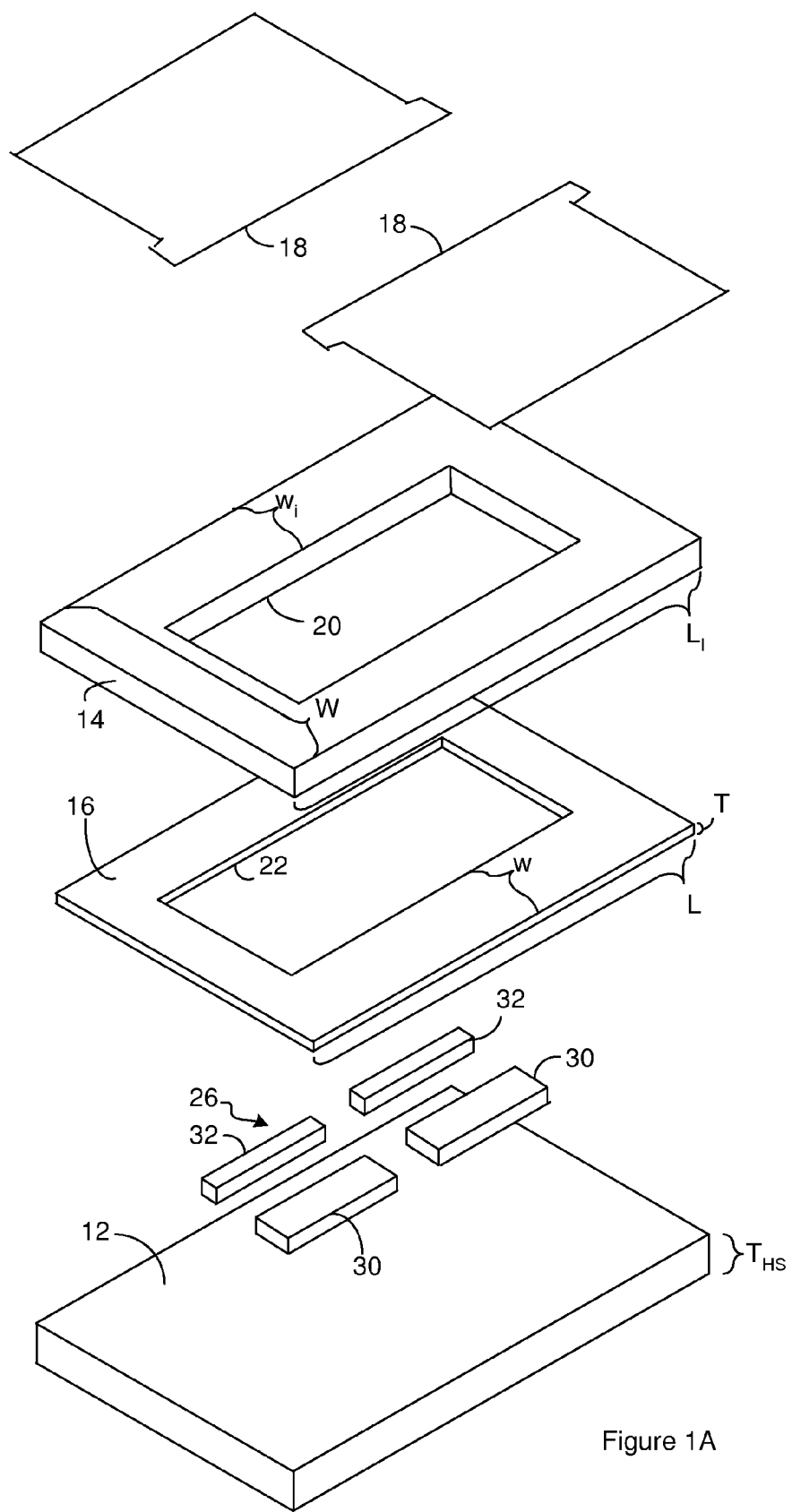
FIG. 1A is an exploded view of an electronics packaging system.
Figure 1B:
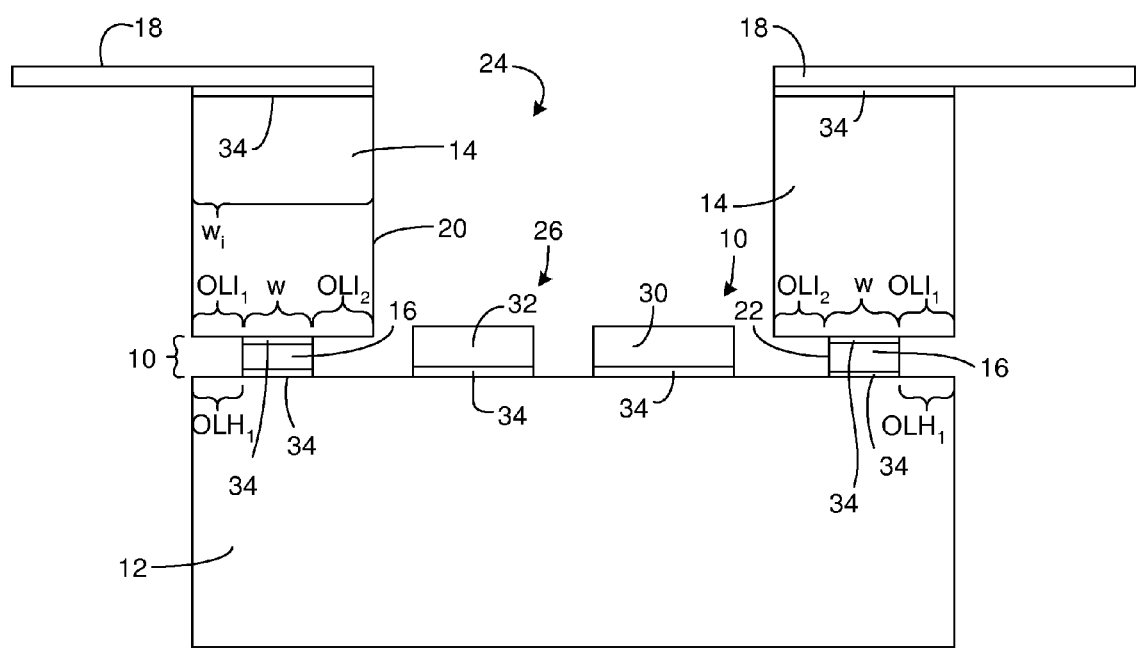
FIG. 1B is a cross section of the electronics packaging system shown in FIG. 1A after the assembly of the system.

FIG. 1A is an exploded view of an electronics packaging system. FIG. 1B is a cross section of the electronics packaging system shown in FIG. 1A after the assembly of the system. The system includes an interface 10 between a heat sink 12 and an insulator 14. The interface 10 includes or consists of a stress reliever 16.

The stiffness of the stress reliever 16 is a measure of the stress relievers 16 resistance to being bent by a force that is perpendicular to the top or bottom surfaces of the stress reliever 16. The stress reliever 16 can be designed to have a stiffness that increases the stiffness of the interface 10 above the stiffness that the same interface 10 would have without the stress reliever 16. For instance, the stress reliever 16 can increase the stiffness of the interface 10 above the stiffness that would result from the insulator 14 being bonded directly to the heat sink 12 as was attempted in prior packaging. Accordingly, the stress reliever 16 can increase the resistance of the interface 10 to warping and/or camber.

The stiffness of the stress reliever 16 is a function of the Young's modulus. An increased Young's modulus indicates an increased flexural rigidity and accordingly leads to an increased stiffness. A suitable Young's modulus for the stress reliever 16 includes a Young's modulus greater than 275 GPa, or 375 GPa and/or less than 500 GPa. The stiffness of the stress reliever 16 is also a function of a dimensional ratio (width of the stress reliever labeled w in FIG. 1A and FIG. 1B: thickness of the stress reliever labeled T in FIG. 1A). Decreasing the dimensional ratio of the stress reliever 16 can lead to an increased stiffness for the stress reliever 16. In some instances, the dimensional ratio is greater than 1:1, or 4:1 and/or less than 4:1, 10:1, 20:1, or 320:1. A suitable width for the stress reliever 16 includes, but is not limited to, a width greater than 1 Mil (thousandth of an inch), 4 Mil and/or less than 10 Mil, 80 Mil or 200 Mil. A suitable thickness for the stress reliever 16 includes, but is not limited to, a thickness greater than 0.5 Mil (thousandth of an inch), 1 Mil, 2 Mil and/or less than 10 Mil or 20 Mil. In some instances, the Young's modulus for the stress reliever 16 is greater than 275 GPa, or 375 GPa and/or the dimensional ratio is less than 4:1, 10:1, 20:1, or 320:1.

The Coefficient of Thermal Expansion (CTE) of the stress reliever 16 need not be matched to the CTE of the heat sink 12 or of the insulator 14. For instance, the CTE of the stress reliever 16 need not be between the CTE of the heat sink 12 and the insulator 14 although such an arrangement is possible. In some instances, the system is constructed with the CTE of the heat sink 12 is greater than the CTE of the insulator 14. In these instances, the CTE of the stress reliever 16 can be less and the CTE of the heat sink 12, less than the CTE of the insulator 14, or even greater than the CTE of the heat sink 12. Reducing the area of contact between the insulator 14 and the stress reliever 16 reduces the level of stress that results from the differential between the CTE of the stress reliever 16 and the CTE of the insulator 14. For instance, reducing the area of the insulator 14 that is attached to the stress reliever 16 can reduce the total level of stress that the heat sink 12 applies to the insulator 14 in response to temperature changes. When the entire width (labeled w in FIG. 1B) of the stress reliever 16 is attached to the insulator, the surface area between the insulator 14 and stress reliever 16 can be reduced by reducing the width (labeled w in FIG. 1B) of the stress reliever 16. When a portion of the width (labeled w in FIG. 1A and FIG. 1B) of the stress reliever 16 is attached to the insulator, the surface area between the insulator 14 and stress reliever 16 can be reduced by reducing fraction of the width of the stress reliever 16 that is attached to the insulator. In some instances, the percentage of the width of the insulator (labeled $w_i$ in FIG. 1B) that is attached to the stress reliever is greater than 10% or 25% and/or less than or equal to 30%, 50%, or 100%. Additionally or alternately, in some instances, the width for the insulator is greater than 5 Mil, or 20 Mil, 30 Mil and/or less than 80 Mil or 200 Mil. As noted above, in some instances, the width of the stress reliever 16 includes, but is not limited to, a width greater than 0.5 Mil, 1 Mil, 2 Mil and/or less than 10 Mil, 80 Mil or 200 Mil.

The lateral external perimeter of the stress reliever 16 can optionally be smaller than the lateral external perimeter of the insulator 14. As a result, one or more overlapping portions of the insulator 14 can extend beyond the exterior perimeter of the stress reliever 16 and/or beyond the interior perimeter of the stress reliever 16. FIG. 1B illustrates an overlapping portion of the insulator 14 extending beyond the exterior perimeter of the stress reliever 16 and a second overlapping portion of the insulator 14 extending beyond the interior perimeter of the stress reliever 16. One or more overlapping portions of the insulator 14 can optionally surround the stress reliever 16 and/or the stress reliever 16 can surround one or more overlapping portions of the insulator 14. The overlapping portions of the insulator 14 are labeled $OLI_1$ and $OLI_2$ in FIG. 1B. The overlapping portions of the insulator 14 can be symmetric but need not be symmetric. For instance, $OLI_1$ can be the same as $OLI_2$ or different from $OLI_2$. Suitable $OLI_D$ and/or $OLI_2$ include, but is not limited to, values greater than or equal to 0 Mil.

Reducing the area of contact between the insulator 14 and the heat sink reduces the level of stress that results from the differential between the CTE of the stress reliever 16 and the CTE of the heat sink. For instance, reducing the area of the insulator 14 that is attached to the heat sink can reduce the total level of stress that the heat sink applies to the stress reliever 16 in response to temperature changes. When the entire width of the stress reliever 16 is attached to the heat sink, the surface area between the heat sink and stress reliever 16 can be reduced by reducing the width of the stress reliever 16. When a portion of the width of the stress reliever 16 is attached to the heat sink, the surface area between the insulator 14 and stress reliever 16 can be reduced by reducing fraction of the width of the stress reliever 16 that is attached to the heat sink. In some instance, a width of the portion of the heat sink that is attached to the stress reliever is greater than 1 Mil (thousandth of an inch), 4 Mil and/or less than 10 Mil, 80 Mil or 200 Mil.

The lateral external perimeter of the stress reliever 16 can be smaller than the lateral external perimeter of the heat sink 12. Accordingly, one or more overlapping portions of the heat sink 12 can extend beyond the exterior perimeter of the stress reliever 16. FIG. 1B illustrates an overlapping portion of the heat sink 12 extending beyond the exterior perimeter of the stress reliever 16. The overlapping portion of the heat sink 12 can optionally surround the stress reliever 16. The overlapping portion of the insulator 14 is labeled $OLH_1$ and $OLH_2$. The overlapping portions of the insulator 14 can be symmetric but need not be symmetric. Suitable $OLH_1$ include, but is not limited to, values greater than or equal to 0 Mil.

Although the stress reliever 16 is illustrated as a single layer of material, the stress reliever 16 can be constructed of multiple layers of material. Suitable materials for the different layers of a stress reliever 16 include, but are not limited to, molybdenum, tungsten, iron, iron-nickel alloys, combinations thereof, and alloys that include molybdenum, tungsten, and iron. Accordingly, the stress reliever 16 can include or consist of molybdenum, tungsten, iron, iron-nickel alloys, combinations thereof, and alloys that include molybdenum, tungsten, and iron. In one example, the stress reliever 16 is a single layer of material that includes or consists of molybdenum.

Since the stress reliever 16 also addresses the CTE mismatch between the insulator 14 and the heat sink 12, the number of possible heat sink 12 constructions increases. For instance, materials that provide a CTE mismatch of more than 1.5:1, 2:1 are now possible. Accordingly, in some instances, the CTE for the heat sink 12 exceeds the CTE for the insulator 14 by more than 6 ppm/K. Since this level of CTE differential is now possible, heat sink 12 materials that are both cheap and have a high thermal conductivity are now possible. As a result, a suitable heat sink 12 can have a thermal conductivity higher than 250 W/mK and/or a CTE greater than 12 ppm/K. Further, the heat sink 12 construction can be simplified. For instance, the heat sink 12 need not be a multilayer laminate although multilayer structures are possible. As an example, the heat sink 12 can now include or consist of Oxygen Free Copper (OFC). Examples of suitable heat sink 12 materials include, but are not limited to, Oxygen Free Copper (OFC) and copper based laminates.

Leads 18 for connecting the system to an external circuit are attached to the insulator 14. Suitable leads 18 include, but are not limited to, sheets of electrically conducting materials such as nickel, and iron-nickel alloys.

An insulator opening 20 extends through the insulator 14 and a reliever opening 22 extends through the stress reliever 16. The insulator and stress reliever 16 are positioned on the heat sink 12 such that the insulator opening 20, reliever opening 22 and the heat sink 12 define a portion of a cavity 24 within the packaging. The system includes one or more electronics devices 26 positioned in the cavity 24. As evident from FIG. 1B, the cavity 24 can be constructed such that the one or more devices 26 do not extend beyond the upper edge of the cavity 24. In some instances, the insulator 14 and/or the stress reliever 16 surround all or a portion of the one or more devices 26 and/or surround the footprint of the one or more devices 26 on the heat sink 12.

The one or more devices 26 are positioned on the heat sink 12 in a manner that provides efficient transfer of thermal energy between the device 26 and the heat sink 12. For instance, the one or more devices 26 can be semiconductor devices that include a die in contact with the heat sink 12 and in contact with a thermally conducting layer that is in contact with the heat sink 12.

Figure 1C:
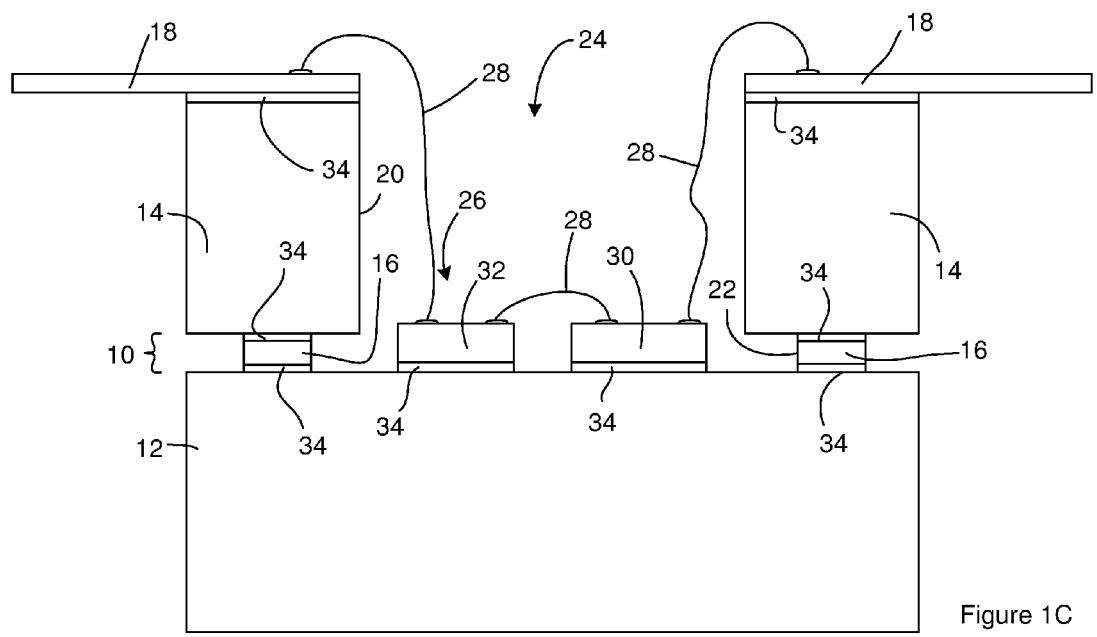
FIG. 1C illustrates electrical connections within a system constructed according to FIG. 1A through FIG. 1B.

FIG. 1C illustrates electrical connections 28 within an assembled package constructed according to FIG. 1A through FIG. 1B. After the packaging is assembled, electrical connections 28 between the devices 26 and the leads 18 can be made. The electrical connections 28 provide electrical communication between a lead 18 and a device 26 or between devices 26. For instance, the electrical connections 28 can extend directly from contact pads (not shown) on the device 26 to the leads 18 or between contact pads on different devices 26. Suitable electrical connections 28 include, but are not limited to, aluminum wires. Suitable methods for attaching the electrical connections 28 to the pads and the leads 18 include, but are not limited to, wire bonding and ball bonding. FIG. 1C illustrates a single electrical connection 28 between each lead 18 and one of the devices 26; however, there can be multiple connections 28 between a lead 18 and one or more of the devices 26. Additionally, FIG. 1C illustrates a single electrical connection 28 between devices 26; however, there can be multiple electrical connections 28 between one of the devices 26 and one or more of the other devices 26. The electrical connections 28 are made as is needed for the successful operation of the one or more devices 26 included in the packaging as is well known in the art.

The devices 26 in the system illustrated in FIG. 1A through FIG. 1C are configured to amplify RF signals for driving an antenna at a cellular communications tower or base station. Accordingly, the illustrated devices 26 include semiconductor power amplifiers 30 and capacitors 32. The capacitors are optional and can be selected to provide impedance matching. Although multiple amplifiers 30 and capacitors 32 are illustrated, the system can include a single amplifier alone or in combination with a single capacitor. Suitable semiconductor power amplifiers and/or capacitors can have a die that includes or consists of silicon or gallium nitride. Suitable amplifiers for use in driving an antenna at a cellular communications provide output power greater than 40 Watts and can go up to 200. An example of a suitable amplifier includes, but is not limited to, part number CLF1G0035-50 which is available from NXP semiconductors and is configured to provide 50-100 W of output power.

As is evident in FIG. 1B and FIG. 1C, the system includes multiple attachment layers 34 that immobilize the different components of the system relative to one another. The attachment layers 34 between different components can be the same or different. Examples of suitable attachment layers 34 include, but are not limited to, solder, brazes, and epoxies.

Figure 2:
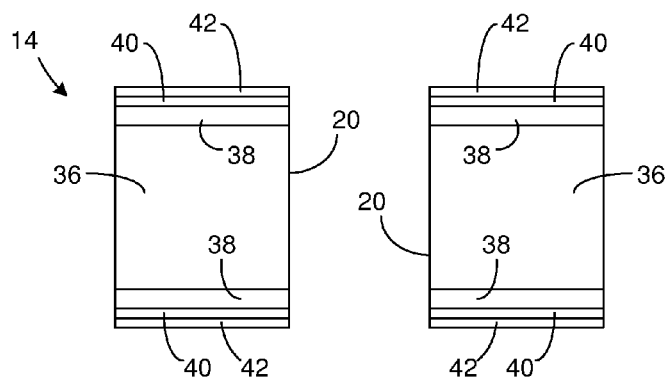
FIG. 2 is a cross section of an insulator included in a system such as the system illustrated in FIG. 1A through FIG. 1C.

FIG. 1A through FIG. 1C illustrates several of the packaging components as being constructed from a single layer of material; however, one or more of the packaging components can have a multi-layer construction before and/or after assembly of the package. To illustrate this principle, FIG. 2 is a cross section of the insulator 14. The insulator 14 includes an electrical insulator 36 between bonding layers 38. Suitable materials for the electrical insulator 36 include, but are not limited to, ceramics such as aluminum oxide ceramics. A particular example of a material for the electrical insulator 36 is 92% alumina. The materials for the electrical insulator 36 typically do not bond well to the materials for a heat sink 12. As a result, the materials for the bonding layers 38 can be selected for their ability to bond to the heat sink 12 better than the electrical insulator 36. Examples of suitable bonding layers 38 include, but are not limited to, metals such as tungsten, molybdenum, and molybdenum manganese. Accordingly, the insulator 14 can be a metallized insulator. When the bonding layer 38 includes metal, the bonding layer 38 can often be attached to the electrical insulator 36 using techniques such as screen-printing.

The insulator 14 includes plating layers 40 on the bonding layers 38. In some instances, one or more of the plating layer 40 is in direct contact with underlying bonding layer 38. The plating layers 40 include or consist of a material that provides wetting of the underlying bonding layer 38 while forming the attachment layer 34. Suitable materials for the plating layers 40 include, but are not limited to, nickel and phosphorous. The insulator 14 includes passivation layers 42 on the plating layers 40. In some instances, one or more of the passivation layers 42 is in direct contact with an underlying plating layer 40. The passivation layer 42 can include or consist of a material that stops or reduces oxidation of the underlying plating layer 40. For instance, when a plating layer 40 is nickel phosphorous, the passivation layer 42 can include or consist of gold. During the formation of the attachment layers 34, the passivation layers 42 and/or the plating layers 40 can become incorporated into the resulting attachment layer 34. Accordingly, the passivation layers 42 and/or the plating layers 40 may not be readily evident in the final system.

Figure 3:
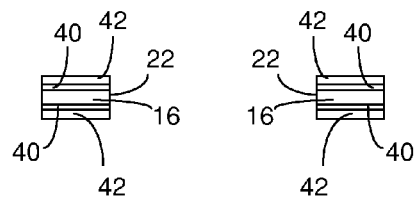
FIG. 3 is a cross section of a stress reliever that includes passivation layers.

Passivation layers 42 can be positioned on other components of the system. For instance, passivation layers 42 can be positioned on the stress reliever 16. FIG. 3 is a cross section of a stress reliever 16 that includes plating layers 40 and passivation layers 42.

In some instances, the system is assembled by concurrently forming all of the attachment layers 34 followed by making the electrical connections 28. All of the attachment layers 34 can be formed concurrently by placing an attachment layer precursor in the locations that are desired for an attachment layer 34 followed by placement of the resulting packaging precursor in a furnace for a period of time. The period of time and temperature can be selected such that the attachment layer precursor is converted to the desired attachment layer 34. The conversion to the desired attachment layer 34 can occur while the packaging precursor is in the furnace or upon cooling of the packing precursor. An example of a suitable attachment layer precursor includes, but is not limited to, solders and, filler metals for brazing. In some instances, the attachment layer precursor is selected such that the furnace is at a temperature greater than 280 C, or 300 C and/or less than 900 C.

In some instances, the packaging is assembled before the one or more devices 26 are attached to the packaging. For instance, the attachment layers 34 between the heat sink 12, the stress reliever 16, the insulator 14, and the leads 18 can be formed sequentially or concurrently. After these attachment layers 34 are formed, the devices 26 can be attached to the packaging followed by making the electrical connections 28. This method of forming the system allows a customer to purchase the packaging and then add their own electronic devices 26 to the packaging.

The above descriptions of the methods for assembling the system illustrate that in some instances, the attachment layers 34 are formed sequentially. In these instances, the process of forming an attachment layer 34 can be performed without melting a previously formed attachment layer 34. For instance, the materials for forming the attachment layers 34 can be selected such that an attachment layer 34 is formed at a lower temperature than the melting point of a previously formed attachment layer 34. Additionally or alternately, the materials for forming the attachment layers 34 can be selected such that the melting point of the resulting attachment layer 34 is higher than the temperature at which the same attachment layer 34 is formed. For instance, the passivation layer 42 and/or the plating layer 40 can include or consist of a melting point elevation material that combines with other materials in the attachment layer 34 so as to increase the melting point of the attachment layer 34 above the melting point of the attachment layer precursors.

As noted above, the passivation layer 42 can include or consist of gold. Gold is an example of a melting point elevation material. For instance, when the solder is eutectic gold tin and the passivation passivation layer 42 is gold, an attachment layer 34 can be formed at 280° C. However, the resulting attachment layer 34 will have a melting point at greater than 320° C. The increase in the melting point is a result of the gold going into solution with the eutectic gold tin solder in the attachment layer 34. In contrast, if the attachment layer 34 were formed without a melting point elevation material, the melting point of the resulting attachment layer 34 would generally be at or near the melting point of the melting point of the attachment layer precursors. As a result of the increased melting point, one or more additional attachment layers 34 can be formed without melting the previously formed attachment layer 34. This arrangement allows the devices 26 to be bonded to the packaging after formation of the packaging. For instance, the insulator 14 and the stress reliever 16 can both include passivation layers 42 that include or consist of one or more melting point elevation materials such as gold. Accordingly, the leads 18, insulator 14, stress reliever 16, and heat sink 12 can be concurrently bonded without bonding the devices 26. At a later time, the devices 26 can then be bonded to the heat sink 12 followed by making the electrical connections 28.

In some instances, the packaging has an aspect ratio (ratio of insulator perimeter length labeled $L_I$ in FIG. 1A: insulator perimeter width labeled W in FIG. 1A) greater than 1:1, 1.4 and/or less than 4:1. In some instances, the length of the insulator 14 is less than 1.5 inches, or 1 inch and/or the perimeter width of the insulator 14 is less than 1 inch, or 0.5 inch. Additionally or alternately, in some instances, the thickness of the heat sink 12 (labeled $T_{HS}$ in FIG. 1A) is less than 80 Mil.

Although the electronics packaging system is disclosed in the context of packaging that includes only two leads 18, the packaging can include more than two leads as is known in the art and as is needed for the performance of the enclosed electronics.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. An electronics packaging system, comprising:
   an insulator that electrically insulates a heat sink from electrical leads;
   a soldered interface between the insulator and the heat sink, the interface having a plurality of layers including a stress reliever constructed such that a stiffness of the interface with the stress reliever greater than the stiffness of the interface alone, wherein the stress reliever has a Young's modulus greater than 275 GPa and includes one or more components selected from a group consisting of molybdenum, tungsten, iron, and iron-nickel alloy; and
   one or more electronic devices, the one or more electronic devices wire-bonded to their respective leads through an opening in the interface.

2. The system of claim 1, wherein a ratio of a width of the stress reliever: a thickness of the stress reliever is less than 320:1, and the width of the stress reliever is measured between an interior perimeter of the stress reliever and an exterior perimeter of the stress reliever.

3. The system of claim 1, wherein the heat sink includes Oxygen Free Copper (OFC).

4. The system of claim 3, wherein the heat sink consists of Oxygen Free Copper (OFC).

5. The system of claim 1, wherein a percentage of a width of the insulator that is attached to the stress reliever is greater than 10% and/or less than 90%, than an entire width of the insulator, wherein a width of the insulator is measured between an interior perimeter of the insulator and an exterior perimeter of the insulator.

6. The system of claim 1, wherein the insulator extends beyond the stress reliever by more than 1 Mil.

7. The system of claim 1, wherein a width of a portion of the heat sink that is attached to the stress reliever is less than 10 Mil.

8. The system of claim 1, wherein the heat sink extends beyond an external perimeter of the stress reliever by more than 1 Mil.

9. The system of claim 1, wherein the one or more electronic devices include a semiconductor power amplifier.

10. The system of claim 1, wherein a difference in the Coefficient of Thermal Expansion (CTE) of the heat sink and the insulator is greater than 12 ppm/K.

* * * * *